(12) United States Patent
Kotani (10) Patent No.: US 7,053,450 B2
(45) Date of Patent: May 30, 2006

(54) SEMICONDUCTOR DEVICE AND METHOD FOR FABRICATING THE SAME

(75) Inventor: Naoki Kotani, Hyogo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 10/834,112

(22) Filed: Apr. 29, 2004

(65) Prior Publication Data
US 2005/0001297 A1 Jan. 6, 2005

(30) Foreign Application Priority Data
Jul. 2, 2003 (JP) .............................. 2003-190462

(51) Int. Cl.
*H01L 29/78* (2006.01)
(52) U.S. Cl. .................. 257/344; 257/288; 257/402; 257/404; 257/408; 438/289; 438/291
(58) Field of Classification Search ................ 257/678, 257/288, 402, 404, 408, 344, E29.053, E21.435; 438/289, 291, 542, 217
See application file for complete search history.

(56) References Cited

U.S. PATENT DOCUMENTS

| | | | | |
|---|---|---|---|---|
| 3,653,978 A | * | 4/1972 | Robinson et al. | ........... 438/217 |
| 5,218,221 A | * | 6/1993 | Okumura | ................ 257/336 |
| 5,427,964 A | * | 6/1995 | Kaneshiro et al. | ........... 438/231 |
| 5,712,814 A | * | 1/1998 | Fratin et al. | ................. 365/182 |
| 6,333,217 B1 | * | 12/2001 | Umimoto et al. | ........... 438/197 |
| 6,548,842 B1 | * | 4/2003 | Bulucea et al. | ............. 257/288 |
| 6,599,819 B1 | | 7/2003 | Goto | |
| 6,613,637 B1 | * | 9/2003 | Lee et al. | ................... 438/301 |

FOREIGN PATENT DOCUMENTS

| | | |
|---|---|---|
| JP | 6-037309 | 2/1994 |
| JP | 6-275636 | 9/1994 |
| JP | 7-78984 A | 3/1995 |
| JP | 2000-340671 | 12/2000 |
| JP | 2002-270824 A | 9/2002 |
| JP | 2003-051581 | 2/2003 |

* cited by examiner

*Primary Examiner*—Kenneth Parker
*Assistant Examiner*—Chris C. Chu
(74) *Attorney, Agent, or Firm*—McDermott Will & Emery LLP (57) ABSTRACT

A MISFET in a semiconductor device has a gate insulating film provided on a substrate, a gate electrode provided on the gate insulating film, sidewalls provided on the side surfaces of the gate electrode, lightly doped diffusion layers provided in the respective regions of the substrate located below the edge portions of the gate electrodes, heavily doped diffusion layers provided in the respective regions of the substrate located laterally below the gate electrode and the sidewalls, and pocket diffusion layers covering the lower portions of the lightly doped diffusion layers and parts of the side surfaces thereof in overlapping relation with each other below the gate electrode. Impurity concentrations in the pocket diffusion layers are set such that the threshold of the MISFET has a desired value.

5 Claims, 7 Drawing Sheets

SEMICONDUCTOR DEVICE AND METHOD FOR FABRICATING THE SAME

The present application claims priority under 35 U.S.C. § 119(a) to Japanese Patent Application JP 2003-190462, the entire content of which is incorporated herein by reference.

BACKGROUND OF THE INVENTION

1. Field of the Invention

The present invention relates to a semiconductor device having a MISFET and to a method for fabricating the same.

2. Description of the Related Art

As miniaturization has been pursued in the field of semiconductor devices, the trends toward higher-speed operation and lower power consumption have been rapidly accelerated in recent years. In step with these trends, a diffusion profile in a MISFET has been changing significantly. A recent MISFET fabrication process is more complicated and includes an increased number of mask steps than a conventional MISFET fabrication process.

Figure 7:
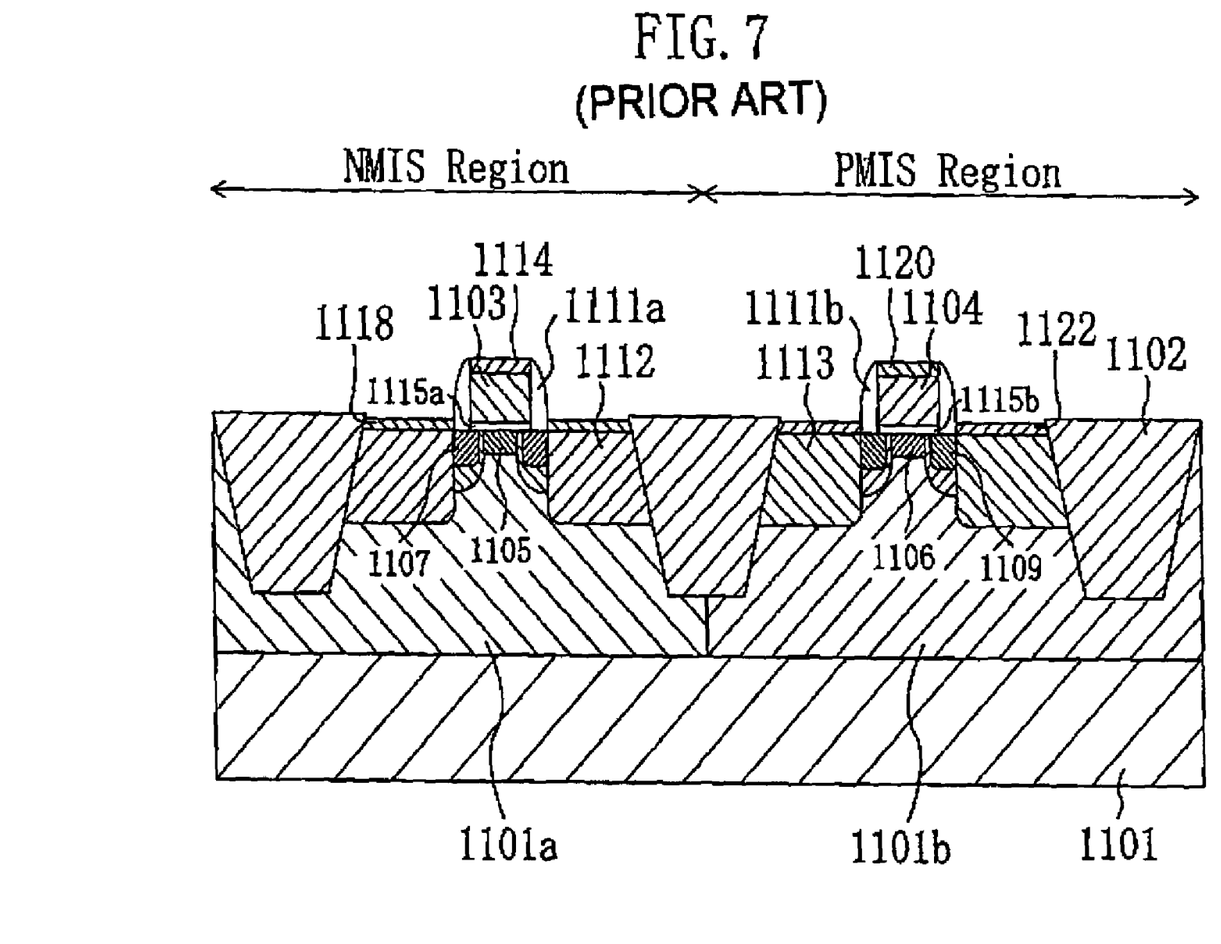
FIG. 7 is a cross-sectional view of a conventional semiconductor device.

FIG. 7 is a cross-sectional view of a conventional semiconductor device. For the simultaneous illustration of semiconductor elements of different conductivity types included in the semiconductor device, an example is shown in the drawing where a region to be formed with an n-channel MISFET (hereinafter referred to as an NMIS formation region) and a region to be formed with a p-channel MISFET (hereinafter referred to as a PMIS formation region) are provided in the semiconductor device and these regions are isolated by a trench isolation insulating film 1102 formed in a semiconductor substrate 1101.

In the conventional semiconductor device, a p-well region 1101a is formed on the NMIS formation region of the semiconductor substrate 1101 and an n-channel MISFET is provided over the p-well region 1101a, while an n-well region 1101b is formed on the PMIS formation region of the semiconductor substrate 1101 and a p-channel MISFET is provided thereover.

A conventional n-channel MISFET comprises: a gate insulating film 1115a provided on the p-well region 1101a; an n-type gate electrode 1103 provided on the gate insulating film 1115a; and sidewalls 1111a composed of an insulator provided on each of the side surfaces of the n-type gate electrode 1103. The p-well region 1101a is provided with: a p-type threshold control layer 1105 formed in a channel region immediately under the gate insulating film 1115a; n-type lightly doped diffusion layers 1107 formed immediately below the edge portions of the n-type gate electrode 1103 in such a manner as to sandwich the p-type threshold control layer 1105 therebetween; n-type heavily doped diffusion layers 1112 formed laterally below the n-type gate electrode 1103 and the sidewalls 1111a; and p-type pocket diffusion layers 1108 formed under the n-type lightly doped diffusion layers 1107. Silicide layers 1114 and 1118 are further formed on the n-type gate electrode 1103 and each of the n-type heavily doped diffusion layers 1112, respectively.

A conventional p-channel MISFET comprises: a gate insulating film 1115b provided on the n-well region 1101b; a p-type gate electrode 1104 provided on the gate insulating film 1115b; and sidewalls 1111b composed of an insulator provided on each of the side surfaces of the p-type gate electrode 1104. The n-well region 1101b is provided with: an n-type threshold control layer 1106 formed in a channel region immediately under the gate insulating film 1115b; p-type lightly doped diffusion layers 1109 formed immediately below the edge portions of the p-type gate electrode 1104 in such a manner as to sandwich the n-type threshold control layer 1106 therebetween; p-type heavily doped diffusion layers 1113 formed laterally below the p-type gate electrode 1104 and the sidewalls 1111b; and n-type pocket diffusion layers 1110 formed under the p-type lightly doped diffusion layers 1109. Silicide layers 1120 and 1122 are further formed on the p-type gate electrode 1104 and each of the p-type heavily doped diffusion layers 1113, respectively.

In the conventional semiconductor device described above, the p-type threshold control layer 1105 and the n-type threshold control layer 1106 are for adjusting the respective thresholds of the n-channel MISFET and the p-channel MISFET to desired values and are formed by well-known ion implantation using a mask. Each of the concentration of a p-type impurity contained in the p-type threshold control layer 1105 and the concentration of an n-type impurity contained in the n-type threshold control layer 1106 is $1 \times 10^{12}$ atoms/cm$^2$ or less. The optimum value of the impurity concentration in each of the threshold control layers differs depending on the gate length and the thickness of the gate insulating film.

On the other hand, the p-type pocket diffusion layers 1108 and the n-type pocket diffusion layers 1110 are for reducing short channel effects occurring in the n-channel MISFET and the p-channel MISFET and are formed by ion implantation using a mask different from that used for forming the threshold control layers. Each of the p-type impurity concentrations in the p-type pocket diffusion layers 1108 and the n-type impurity concentrations in the n-type pocket diffusion layers 1110 is about $1 \times 10^{13}$ atoms/cm$^2$.

A conventional semiconductor device as described above is disclosed in, e.g., Japanese Laid-Open Patent Publication No. 2002-270824.

SUMMARY OF THE INVENTION

In the foregoing conventional semiconductor device, when the gate size of each of the MISFETs is reduced to reach, e.g., 0.13 μm or less, the p-type pocket diffusion layer 1108 formed closer to the source and the p-type pocket diffusion layer 1108 formed closer to the drain come in proximity or contact with each other. Likewise, the n-type pocket diffusion layer 1110 formed closer to the source and the n-type pocket diffusion layer 1110 formed closer to the drain also come in proximity or contact with each other. As a result, the p-type threshold control layer 1105 and the n-type threshold control layer 1106 no more function effectively and it becomes difficult to obtain desired threshold voltages. In addition, a reverse short channel effect involving an increased threshold becomes prominent to cause the degradation of transistor performance.

It is therefore an object of the present invention to provide a semiconductor device comprising a MIS transistor having an extremely fine gate electrode wherein each of the short channel effect and the reverse short channel effect is suppressed and a fabrication method therefor.

It is assumed that the semiconductor device according to the present invention comprises a MISFET of a so-called LDD structure provided in a semiconductor layer and having a lightly doped source diffusion layer, a lightly doped drain diffusion layer, a heavily doped source diffusion layer, and a heavily doped drain diffusion layer, each of which contains an impurity of a second conductivity type. The MISFET is formed with a source-side pocket diffusion layer of a first conductivity type formed immediately below the gate electrode and with a drain-side pocket diffusion layer of the first conductivity type which is in contact or overlapping relation with the source-side pocket diffusion layer immediately below the gate electrode.

By thus forming the source-side pocket diffusion layer and the drain-side pocket diffusion layer in contact or overlapping relation with each other immediately below the gate electrode, it becomes possible to impart not only the ability to reduce the short channel effect but also the ability to adjust the threshold to the pocket diffusion layers. The reason for forming the source-side pocket diffusion layer and the drain-side pocket diffusion layer in contact or overlapping relation is that a part of each of the source-side and drain-side pocket diffusion layers should function as the channel region. The foregoing structure is particularly effective when the gate length of the MISFET is 0.13 µM or less and the MISFET may be of either conductivity.

If it is difficult to adjust the threshold by using only the pocket diffusion layers, a source-side threshold control layer containing an impurity of the first conductivity type at a concentration different from impurity concentration in the source-side pocket diffusion layer may be formed appropriately in the region of the semiconductor layer located above the source-side pocket diffusion layer, while a drain-side threshold control layer containing an impurity of the first conductivity type at a concentration different from a concentration in the drain-side pocket diffusion layer may be formed appropriately in the region of the semiconductor layer located above the drain-side pocket diffusion layer to be in contact or overlapping relation with the source-side threshold control layer below the gate insulating film.

The arrangement allows more precise setting of a threshold for the MISFET.

In the method for fabricating the semiconductor device according to the present invention, a gate insulating film and a gate electrode are provided over the semiconductor layer and then the foregoing lightly doped source/drain diffusion layers and source-side and drain-side pocket diffusion layers are formed each by ion implantation using at least the gate electrode as a mask.

By particularly creating a resist film having an opening over the semiconductor layer prior to the ion implantation step, the resist film can be used as a common mask in the ion implantation step for forming the lightly doped source/drain diffusion layers and in the ion implantation step for forming the source-side and drain-side pocket diffusion layers. The arrangement reduces the number of steps compared with the case where masks are formed individually in the respective ion implantation steps and thereby reduces the fabrication cost for the semiconductor device.

Alternatively, the method for fabricating the semiconductor device according to the present invention further includes the step of implanting, after forming the gate insulating film and the gate electrode, impurity ions in the semiconductor layer by using at least the gate electrode as a mask to form the source-side threshold control layer and the drain-side threshold control layer which is in contact or overlapping relation with the source-side threshold control layer immediately below the gate electrode. The arrangement allows more precise setting of a threshold for even a miniaturized semiconductor device.

In the ion implantation for forming the source-side and drain-side threshold control layers also, the foregoing resist can be used as a common mask. The arrangement is preferred since it reduces the number of steps compared with the case where implant masks are created individually.

BRIEF DESCRIPTION OF THE DRAWINGS

FIGS. 3A to 3C are cross-sectional views illustrating the individual steps of fabricating the semiconductor device according to the first embodiment;

DETAILED DESCRIPTION OF THE INVENTION

Circumstances Leading to Present Invention

The present inventors first examined whether or not the threshold of a MISFET having a gate size of 0.13 µm or less could be set to a desired value by increasing the concentration of an impurity contained in the threshold control layer. As a result, the present inventors found it difficult to control the threshold to the desired value even by increasing the impurity concentration in the threshold control layer due to the pocket diffusion layers provided without consideration for the threshold.

In the process of the examination, the present inventors noticed that, in some cases, the impurity concentration in the threshold control layer was about $1 \times 10^{13}$ atoms/cm$^2$, which was substantially the same as the concentrations in the pocket diffusion layers, and pursued the possibility of simultaneous formation of the pocket diffusion layers and the threshold control layer. The result of the pursuit proved that it was possible to cause the pocket diffusion layers to serve also as the threshold control layers by adjusting an amount of an implanted impurity to set the threshold of the MISFET to a desired value and forming the source-side pocket diffusion layer and the drain-side pocket diffusion layers in contact or overlapping relation with each other in the step of forming the pocket diffusion layers.

Such a structure achieves a reduction in the number of steps of fabricating the semiconductor device. The result of the pursuit also proved that it was also possible to reduce the short channel effect, while suppressing the occurrence of the reverse short channel effect, by causing the pocket diffusion layers to serve also as the threshold control layers.

A description will be given herein below to the individual embodiments of the semiconductor device according to the present invention and a fabrication method therefor with reference to the drawings.

EMBODIMENT 1

Figure 1:
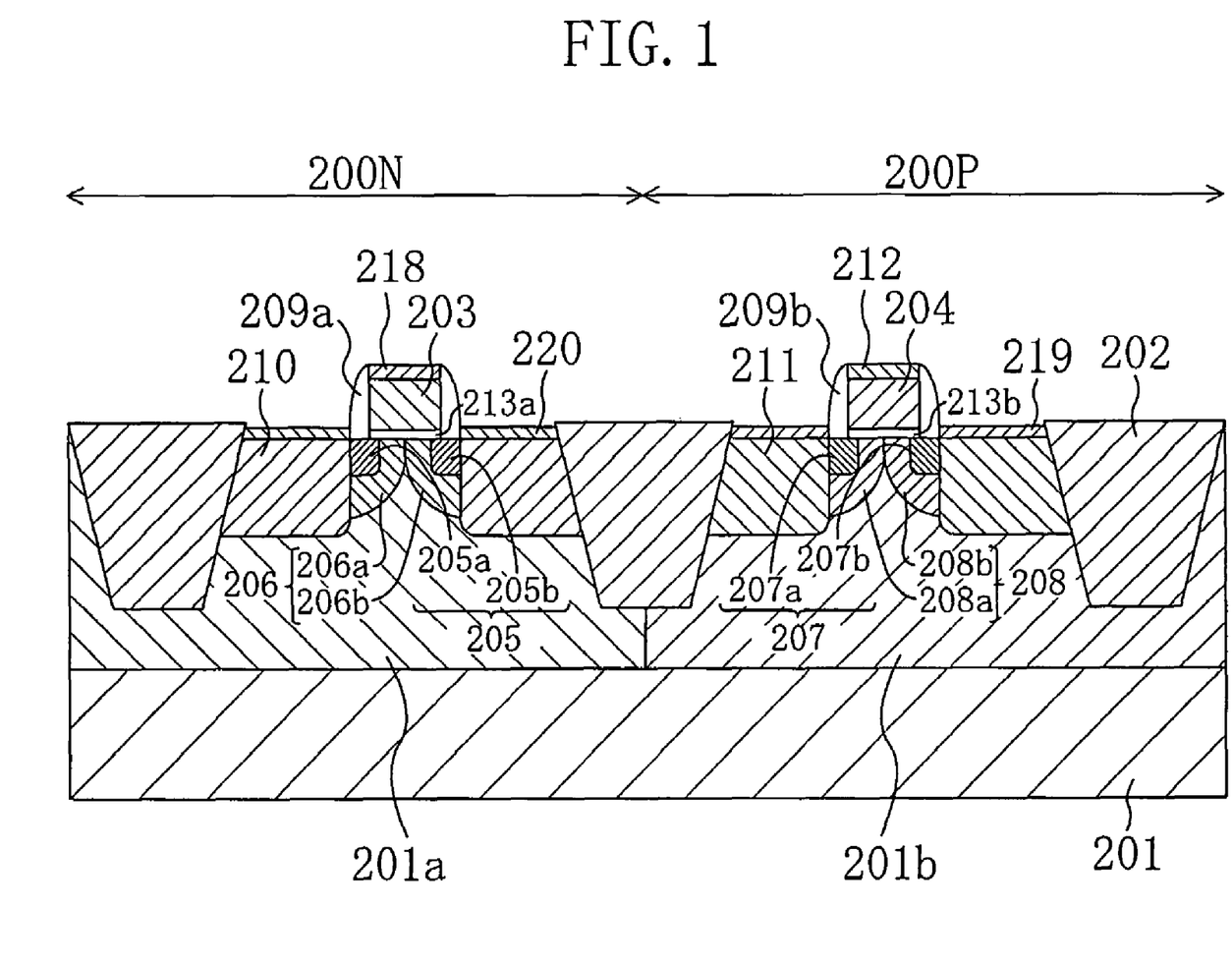
FIG. 1 is a cross-sectional view of a semiconductor device according to a first embodiment of the present invention.

FIG. 1 is a cross-sectional view of a semiconductor device according to the first embodiment of the present invention. For the simultaneous illustration of semiconductor elements of different conductivity types included in the semiconductor device, an example is shown in the drawing where a region to be formed with an n-channel MISFET (hereinafter referred to as an NMIS formation region 200N) and a region to be formed with a p-channel MISFET (hereinafter referred to as a PMIS formation region 200P) are provided in the semiconductor device.

In the semiconductor device according to the present embodiment shown in FIG. 1, the NMIS formation region 200N and the PMIS formation region 200P are isolated by a trench isolation insulating film 202 formed above a semiconductor substrate 201. In the NMIS formation region 200N, a p-well region 201a containing a p-type impurity at a concentration of about $1\times10^{13}$ atoms/cm$^2$ is formed on the semiconductor substrate 201 and an n-channel MISFET is formed in the p-well region 201a. In the PMIS formation region 200P, an n-well region 201b containing an n-type impurity at a concentration of about $1\times10^{13}$ atoms/cm$^2$ is formed on the semiconductor substrate 201 and a p-channel MISFET is formed in the n-well region 201b.

The n-channel MISFET according to the present embodiment comprises: a gate insulating film 213a provided on the p-well region 201a; an n-type gate electrode 203 provided on the gate insulating film 213a; and sidewalls 209a composed of an insulator provided on each of the both side surfaces of the n-type gate electrode 203. The p-well region 201a is provided with: an n-type lightly doped source diffusion layer 205a and an n-type lightly doped drain diffusion layer 205b formed immediately below the edge portions of the n-type gate electrode 203 and the sidewalls 209a to sandwich a channel region therebetween; n-type heavily doped diffusion layers 210 formed laterally below the n-type gate electrode 203 and the sidewalls 209a; a source-side p-type pocket diffusion layer 206a covering the lower portion of the n-type lightly doped source diffusion layer 205a and the side surface thereof closer to the channel region; and a drain-side p-type pocket diffusion layer 206b covering the lower portion of the n-type lightly doped drain diffusion layer 205b and the side surface thereof closer to the channel region in contact or overlapping relation with the source-side p-type pocket diffusion layer 206a below the gate insulating film 213a. In the present specification, the n-type lightly doped source diffusion layer 205a and the n-type lightly doped drain diffusion layer 205b will be generally and comprehensively termed n-type lightly doped diffusion layers 205 and the source-side p-type pocket diffusion layer 206a and the drain-side p-type pocket diffusion layer 206b will be generally and comprehensively termed p-type pocket diffusion layers 206. Silicide layers 218 and 220 are formed on the n-type gate electrode 203 and each of the n-type heavily doped diffusion layers 210, respectively. The respective n-type impurity concentrations in the n-type lightly doped diffusion layers 205 and in the n-type heavily doped diffusion layers 210 are about $8\times10^{14}$ atoms/cm$^2$ and $5\times10^{15}$ atoms/cm$^2$. The concentration of a p-type impurity contained in each of the p-type pocket diffusion layers 206 is set such that the threshold of the n-channel MISFET has a desired value. In the present embodiment, the gate length is about 90 nm, the thickness of the gate insulating film 213a made of SiO$_2$ is about 2 nm, and the concentration of the p-type impurity contained in each of the p-type pocket diffusion layers 206 is about $2.8\times10^{13}$ atoms/cm$^2$.

On the other hand, the p-channel MISFET according to the present embodiment comprises: a gate insulating film 213b provided on the n-well region 201b; a p-type gate electrode 204 provided on the gate insulating film 213b; and sidewalls 209b composed of an insulator provided on each of the both side surfaces of the p-type gate electrode 204.

The n-well region 201b is provided with: a p-type lightly doped source diffusion layer 207a and a p-type lightly doped drain diffusion layer 207b formed immediately below the both edge portions of the p-type gate electrode 204 and the sidewalls 209b to sandwich a channel region therebetween; p-type heavily doped diffusion layers 211 formed laterally below the p-type gate electrode 204 and the sidewalls 209b; a source-side n-type pocket diffusion layer 208a covering the lower portion of the p-type lightly doped source diffusion layer 207a and the side surface thereof closer to the channel region; and a drain-side n-type pocket diffusion layer 208b covering the lower portion of the p-type lightly doped drain diffusion layer 207b and the side surface thereof closer to the channel region in contact or overlapping relation with the source-side n-type pocket diffusion layer 208a below the gate insulating film 213b. In the present specification, the p-type lightly doped source diffusion layer 207a and the p-type lightly doped drain diffusion layer 207b will be generally and comprehensively termed p-type lightly doped diffusion layers 207 and the source-side n-type pocket diffusion layer 208a and the drain-side n-type pocket diffusion layer 208b will be generally and comprehensively termed n-type pocket diffusion layers 208. Silicide layers 211 and 219 are formed on the p-type gate electrode 204 and each of the p-type heavily doped diffusion layers 211, respectively. The respective p-type impurity concentrations in the p-type lightly doped diffusion layers 207 and in the p-type heavily doped diffusion layers 211 are about $1.8\times10^{14}$ atoms/cm$^2$ and $3.6\times10^{15}$ atoms/cm$^2$. The concentration of an n-type impurity contained in each of the n-type pocket diffusion layers 208 is set such that the threshold of the p-channel MISFET has a desired value. In the present embodiment, the gate length is about 95 nm, the thickness of the gate insulating film 213b made of SiO$_2$ is about 2 nm, and the concentration of the n-type impurity contained in each of the n-type pocket diffusion layers 208 is about $2.8\times10^{13}$ atoms/cm$^2$.

With the foregoing structure, each of the MISFETS according to the present embodiment allows the pocket diffusion layers to have a threshold control ability so that it becomes possible to control the threshold with a structure simpler than in the conventional embodiment. With the semiconductor device according to the present embodiment, therefore, the number of steps of fabricating the MISFETs can be reduced and fabrication cost can be suppressed, which will be described later. In addition, the pocket diffusion layers thus constructed can reduce the short channel effect, while suppressing the occurrence of the reverse short channel effect.

A description will be given next to a method for fabricating the semiconductor device according to the present embodiment.

FIGS. 2A to 2C and FIGS. 3A to 3C are cross-sectional views illustrating the individual steps of fabricating the semiconductor device according to the first embodiment.

Figure 2A:
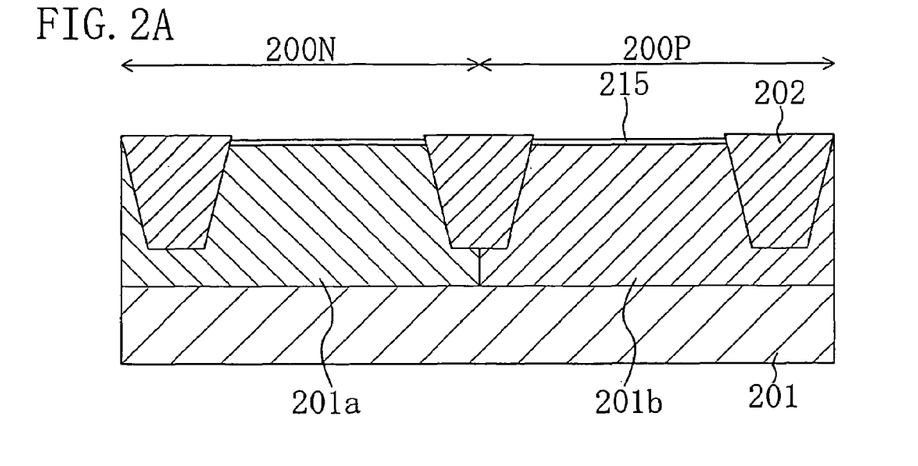
FIGS. 2A to 2C are cross-sectional views illustrating the individual steps of fabricating the semiconductor device according to the first embodiment.

First, in the step shown in FIG. 2A, the isolation insulating film 202 is formed to bury a trench and surround the active region of the substrate by a well-known shallow trench isolation formation process. Then, the p-well region 201a is formed in the n-type MIS transistor formation region (NMIS formation region) 200N, while the n-well region 201b is formed in the p-type MIS transistor formation region (PMIS formation region) 200P. Subsequently, a pad oxide film 215 is formed on each of the p-well region 201a and the n-well region 201b by thermal oxidation. Thereafter, the pad oxide film 215 is delaminated by wet etching and an oxide film (not shown) is grown again on the substrate.

Figure 2B:
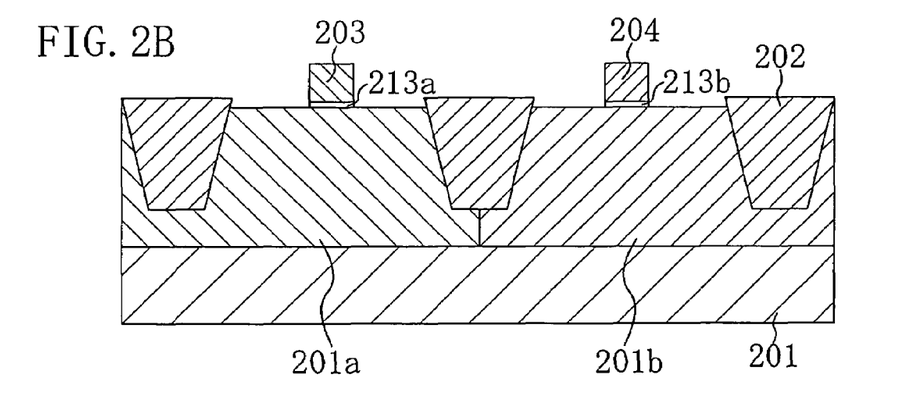

Next, in the step shown in FIG. 2B, polysilicon is deposited on the substrate and then patterned to form the gate insulating film 213a and the n-type gate electrode 203 with a gate length of 90 nm over the active region of the NMIS formation region 200N, while forming the gate insulating film 213b and the p-type gate electrode 204 with a gate length of 95 nm over the active region of the PMIS formation region 200P.

Figure 2C:
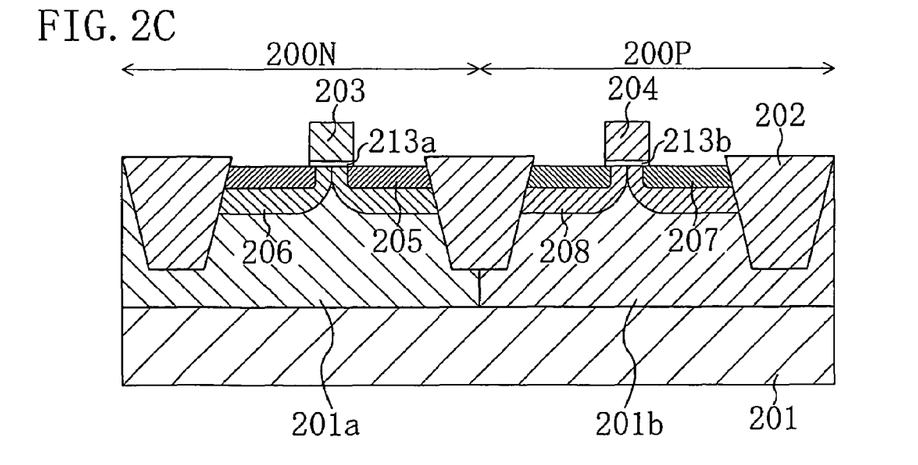

Next, in the step shown in FIG. 2C, a resist (not shown) having an opening corresponding to the NMIS formation region 200N formed with the n-type gate electrode 203 is formed to cover the PMIS formation region 200P. By using the resist and the n-type gate electrode 203 as a mask, n-type impurity ions such as arsenic ions are implanted into the p-well region 201a under such conditions that an acceleration energy is 5 keV, a dose is $8.0 \times 10^{15}$ atoms/cm$^2$, and an implant angle is 0 degree, whereby the n-type lightly doped diffusion layers 205 are formed in the respective regions (source-side and drain-side regions) of the p-well region 201a located below and on both sides of the n-type gate electrode 203. Subsequently, p-type impurity ions such as boron ions are implanted by using the same mask under such implant conditions that an acceleration energy is 12 keV, a dose is $7.0 \times 10^{12}$ atoms/cm$^2$, an implant angle is 25 degrees, and the number of rotations is 4, whereby the p-type pocket diffusion layers 206 are formed to surround the n-type lightly doped diffusion layers 205. At this time, the drain-side p-type pocket diffusion layer 206 and the source-side p-type pocket diffusion layer 206 are formed in overlapping relation with each other immediately below the n-type gate electrode 203.

Next, the lightly doped diffusion layers and the pocket diffusion layers are formed also in the PMIS region 200P in the same manner as in the NMIS region 200N.

Specifically, a resist (not shown) having an opening corresponding to the PMIS formation region 200P formed with the p-type gate electrode 204 is formed first to cover the NMIS formation region 200N. By using the resist and the p-type gate electrode 204 as a mask, p-type impurity ions such as boron ions are implanted into the n-well region 201b under such conditions that an acceleration energy is 0.7 keV, a dose is $1.8 \times 10^{14}$ atoms/cm$^2$, and an implant angle is 0 degree, whereby the p-type lightly doped diffusion layers 207 are formed in the respective regions (source-side and drain-side regions) of the n-well region 201b located below and on both sides of the p-type gate electrode 204. Subsequently, n-type impurity ions such as arsenic ions are implanted by using the same mask under such conditions that an acceleration energy is 70 keV, a dose is $7.0 \times 10^{12}$ atoms/cm$^2$, an implant angle is 25 degrees, and the number of rotations is 4, whereby the n-type pocket diffusion layers 208 are formed to surround the p-type lightly doped diffusion layers 207. At this time, the drain-side n-type pocket diffusion layer 208 and the source-side n-type pocket diffusion layer 208 are formed in overlapping relation with each other immediately below the p-type gate electrode 204. Thus, the implant energy for forming the n-type pocket diffusion layers 208 is set higher than that for forming the p-type lightly doped diffusion layers 207, while the implant angle for forming the n-type pocket diffusion layers 208 is set larger than that for forming the p-type lightly doped diffusion layers 207.

In the present step, it is possible to form the n-type lightly doped diffusion layers 205 after forming the p-type pocket diffusion layers 206. It is also possible to form the p-type lightly doped diffusion layers 207 after forming the n-type pocket diffusion layers 208. To form a desired profile, however, the implantation of arsenic is preferably performed prior to the implantation of boron since boron is readily diffused in the semiconductor substrate.

In the present step, it is also possible to form offset sidewalls each having a thickness of about 10 nm on the side surfaces of the gate electrode prior to the ion implantation for forming the pocket diffusion layers or the lightly doped diffusion layers.

Figure 3A:
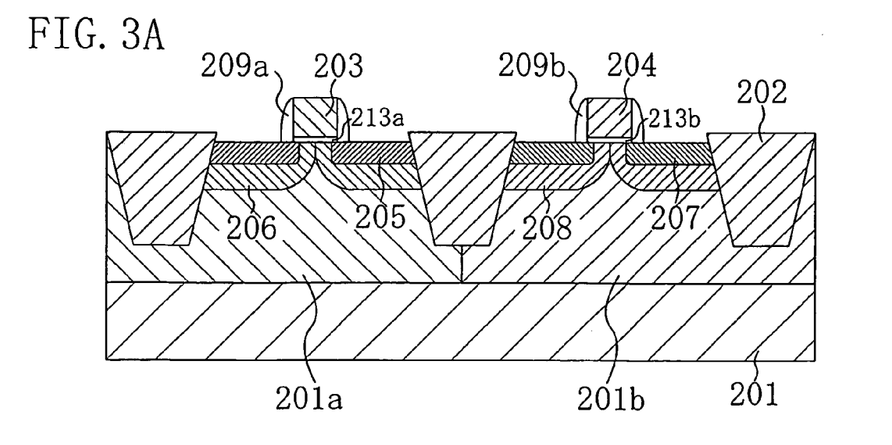

Next, in the step shown in FIG. 3A, an insulating film made of SiO$_2$ or the like is formed over the entire surface of the substrate and then etched by an etch-back process to simultaneously form the sidewalls 209a on the side surfaces of the n-type gate electrode 203 and the sidewalls 209b on the side surfaces of the p-type gate electrode 204.

Figure 3B:
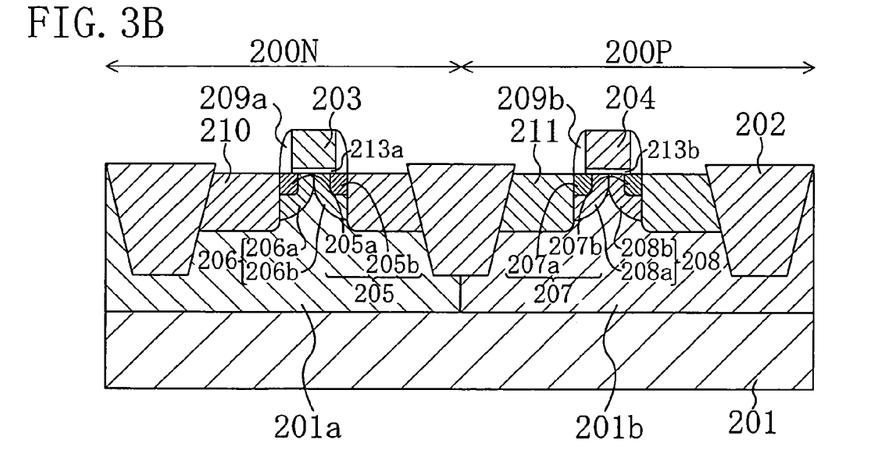

Next, in the step shown in FIG. 3B, a resist having an opening corresponding to the NMIS formation region 200N is formed to cover the PMIS formation region 200P. By using the resist, the n-type gate electrode 203, and the sidewalls 209a as a mask, n-type impurity ions such as arsenic ions are implanted into the p-well region 201a under such conditions that an acceleration energy is 50 keV, a dose is $5.0 \times 10^{15}$ atoms/cm$^2$, and an implant angle is 7 degrees, whereby the n-type heavily doped diffusion layers 210 serving as the n-type source/drain regions are formed in the respective regions of the p-well region 201a located laterally below the n-type gate electrode 203 and the sidewalls 209a.

Next, a resist having an opening corresponding to the PMIS formation region 200P is formed to cover the NMIS formation region 200N. By using the resist, the p-type gate electrode 204, and the sidewalls 209b as a mask, p-type impurity ions such as boron ions are implanted into the n-well region 201b under such conditions that an acceleration energy is 3 keV, a dose is $3.6 \times 10^{15}$ atoms/cm$^2$, and an implant angle is 7 degrees, whereby the p-type heavily doped diffusion layers 211 serving as the p-type source/drain regions are formed in the respective regions of the n-well region 201b located laterally below the p-type gate electrode 204 and the sidewalls 209b.

Next, in the step shown in FIG. 3C, the silicide layers 218, 212, 220, and 219 are formed on the n-type gate electrode 203, the p-type gate electrode 204, each of the n-type heavily doped diffusion layers 210, and each of the p-type heavily doped diffusion layers 211, respectively, by using a well-known salicide technology. The foregoing is the steps by which the semiconductor device according to the present embodiment can be fabricated.

The method for fabricating the semiconductor device according to the present embodiment enables the setting of each of the concentrations of the impurities contained in the p-type pocket diffusion layers 206 and the n-type pocket diffusion layers 208 to a value sufficient to perform the threshold control ability in the step shown in FIG. 2C. As a result, it becomes possible to adjust the threshold of each of the MISFETs to a desired value without providing the threshold control layer. Accordingly, the method for fabricating the semiconductor device according to the present embodiment allows the fabrication of the semiconductor device with the reduced short channel effect and the reduced reverse short channel effect by the fabrication steps smaller in number than in the conventional method. In contrast to the conventional method, the method according to the present embodiment allows the omission of the step of mask formation for threshold control and the step of ion implantation so that the fabrication cost for the semiconductor device is reduced significantly.

To impart the threshold control ability to the pocket diffusion layers in the semiconductor device according to the present embodiment, it is necessary for the two pocket diffusion layers provided in the source-side and drain-side regions to be in contact or overlapping relation with each other below the gate electrode, particularly in the region containing the channel layer. For this reason, the structure of the present embodiment is applied particularly preferably to the case where the gate length is reduced to reach, e.g., 0.13 µm or less. As the gate length is reduced, the impurity concentration necessary for threshold control is increased to approach the impurity concentration in each of the pocket diffusion layers so that the structure of the present embodiment is applied preferably to the case where the gate length is 0.13 µm or less.

EMBODIMENT 2

Figure 4:
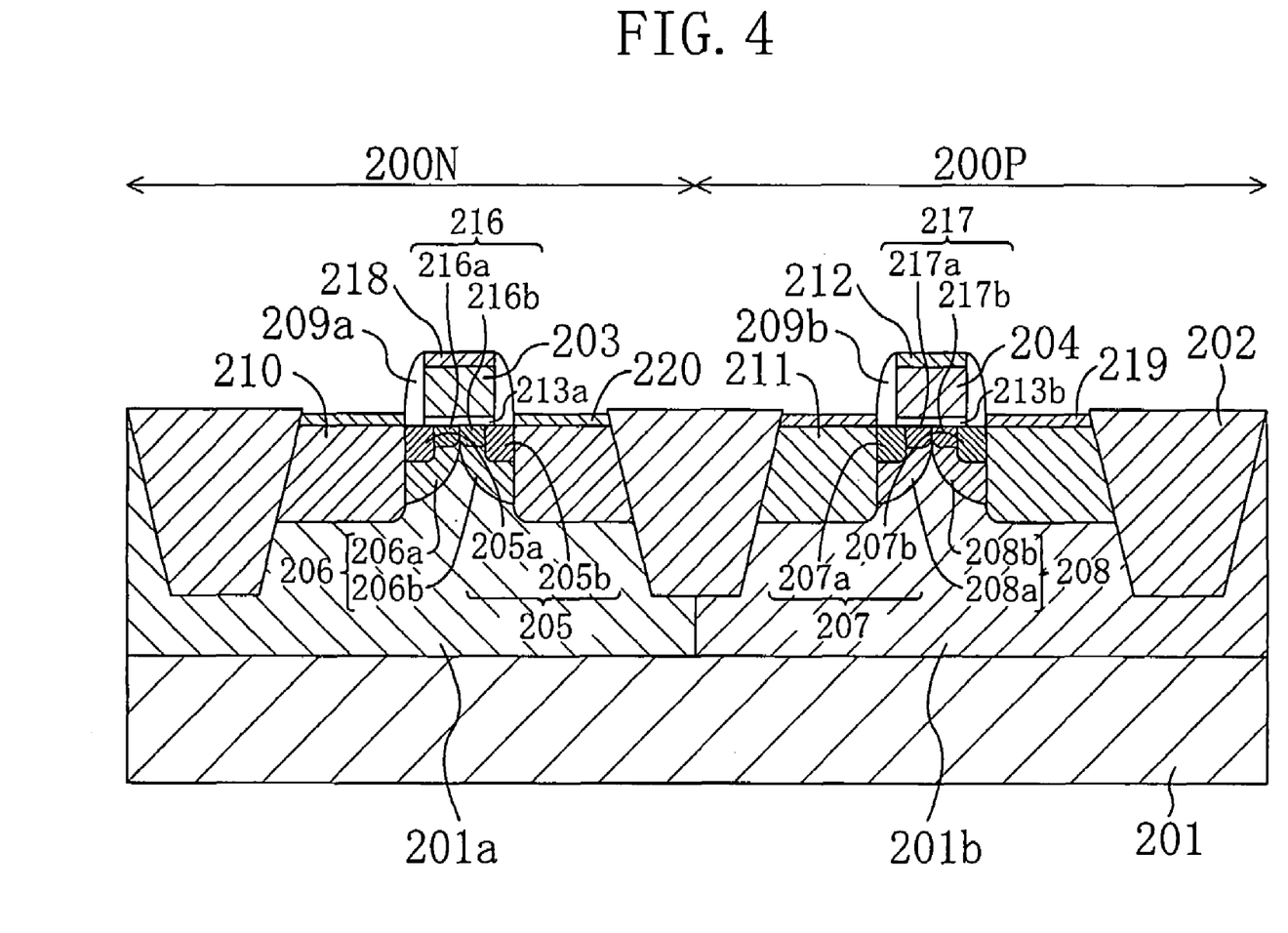
FIG. 4 is a cross-sectional view of a semiconductor device according to a second embodiment of the present invention.

FIG. 4 is a cross-sectional view of a semiconductor device according to the second embodiment of the present invention. In FIG. 4, the same components as shown in FIG. 1 are denoted by the same reference numerals. The semiconductor device according to the present embodiment is different from the semiconductor device according to the first embodiment in that threshold control layers are provided in each of the MISFETS to allow finer control, which will be described later.

In the semiconductor device according to the present embodiment shown in FIG. 4, an NMIS formation region 200N and a PMIS formation region 200P are isolated by a trench isolation insulating film 202 formed above a semiconductor substrate 201. In the NMIS formation region 200N, a p-well region 201a containing a p-type impurity at a concentration of about $1\times10^{13}$ atoms/cm$^2$ is formed on the semiconductor substrate 201 and an n-channel MISFET is formed in the p-well region 201a. In a PMIS formation region 200P, an n-well region 201b containing an n-type impurity at a concentration of about $1\times10^{13}$ atoms/cm$^2$ is formed on the semiconductor substrate 201 and a p-channel MISFET is formed in the n-well region 201b.

The n-channel MISFET according to the present embodiment comprises: a gate insulating film 213a provided on the p-well region 201a; an n-type gate electrode 203 provided on the gate insulating film 213a; and sidewalls 209a composed of an insulator provided on each of the both side surfaces of the n-type gate electrode 203. The p-well region 201a is provided with: first threshold control layers 216 each provided under the gate insulating film 213a and containing a p-type impurity; n-type lightly doped diffusion layers 205 formed immediately below the both edge portions of the n-type gate electrode 203 and the sidewalls 209a to sandwich the first threshold control layers 216 therebetween; n-type heavily doped diffusion layers 210 formed laterally below the n-type gate electrode 203 and the sidewalls 209a; and p-type pocket diffusion layers 206 composed of a source-side p-type pocket diffusion layer 206a and a drain-side p-type pocket diffusion layer 206b covering the bottom portions of the n-type lightly doped diffusion layers 205 and parts of the side surfaces thereof in contact or overlapping relation with each other below the gate insulating film 213a. The first threshold control layers 216 are composed of a source-side first threshold control layer 216a and a drain-side first threshold control layer 216b provided in contact or overlapping relation with each other under (below) the gate insulating film 213a. Silicide layers 218 and 220 are formed on the n-type gate electrode 203 and each of the n-type heavily doped diffusion layers 210, respectively. The respective n-type impurity concentrations in the n-type lightly doped diffusion layers 205 and in the n-type heavily doped diffusion layers 210 are about $8\times10^{14}$ atoms/cm$^2$ and $5\times10^{15}$ atoms/cm$^2$. In the present embodiment, the gate length of the n-type gate electrode 203 is about 90 nm, the thickness of the gate insulating film 213a made of SiO$_2$ is about 2 nm, the concentration of the p-type impurity contained in each of the p-type pocket diffusion layers 206 is about $2.8\times10^{13}$ atoms/cm$^2$, and the concentration of the p-type impurity contained in each of the first threshold control layers 216 is about $8\times10^{12}$ atoms/cm$^2$.

On the other hand, the p-channel MISFET according to the present embodiment comprises: a gate insulating film 213a provided on the n-well region 201b; a p-type gate electrode 204 provided on the gate insulating film 213a; and sidewalls 209b composed of an insulator provided on each of the both side surfaces of the p-type gate electrode 204. The n-well region 201b is provided with: second threshold control layers 217 each formed under the gate insulating film 213b and containing an n-type impurity; p-type lightly doped diffusion layers 207 formed immediately below the both edge portions of the p-type gate electrode 204 and the sidewalls 209b to sandwich the second threshold control layers therebetween; p-type heavily doped diffusion layers 211 formed laterally below the p-type gate electrode 204 and the sidewalls 209b; and n-type pocket diffusion layers 208 composed of a source-side n-type pocket diffusion layer 208a and a drain-side n-type pocket diffusion layer 208b covering the bottom portions of the p-type lightly doped diffusion layers 207 and parts of the side surfaces thereof in contact or overlapping relation with each other below the gate insulating film 213a. The second threshold control layers 217 are composed of a source-side second threshold control layer 217a and a drain-side second threshold control layer 217b provided in contact or overlapping relation with each other under (below) the gate insulating film 213b. Silicide layers 211 and 219 are formed on the p-type gate electrode 204 and each of the p-type heavily doped diffusion layers 211, respectively. The respective p-type impurity concentrations in the p-type lightly doped diffusion layers 207 and in the p-type heavily doped diffusion layers 211 are about $1.8\times10^{14}$ atoms/cm$^2$ and $3.6\times10^{15}$ atoms/cm$^2$. The concentration of the n-type impurity contained in each of the second threshold control layers 217 is set such that the threshold of the p-channel MISFET has a desired value. In the present embodiment, the gate length is about 95 nm, the thickness of the gate insulating film 213b made of SiO$_2$ is about 2 nm, and the concentration of the n-type impurity contained in each of the n-type pocket diffusion layers 208 is about $2.8\times10^{13}$ atoms/cm$^2$. The concentration of the n-type impurity contained in each of the second threshold control layers 217 is about $5.2\times10^{12}$ atoms/cm$^2$.

The foregoing structure enables threshold control for the semiconductor device according to the present embodiment even when the MISFETs are further miniaturized and it becomes difficult to perform threshold control by using only the pocket diffusion layers. In the semiconductor device according to the present embodiment, threshold control can be performed with higher accuracy than in the semiconductor device according to the first embodiment when the gate length of each of the MISFETs is 0.13 µm or less. For example, if the p-type impurity concentration is lower than a set value in the p-type pocket diffusion layers 206 of the n-channel MISFET, the first threshold control layers 216 are formed by further implanting p-type impurity ions. If the p-type impurity concentration is higher than the set value in the p-type pocket diffusion layers 206, the first threshold control layers 216 are formed by further implanting n-type impurity ions. The threshold of the p-channel MISFET can also be set in the same manner.

A preferred value of the concentration of an impurity contained in each of the pocket diffusion layers differs depending on a factor such as the size of the MISFET but, it is not less than $1\times10^{13}$ atoms/cm$^2$ and not more than $1\times10^{15}$ atoms/cm$^2$ when the gate length is 0.13 µm or less.

A description will be given next to a method for fabricating the semiconductor device according to the present embodiment.

FIGS. 5A to 5C and FIGS. 6A to 6C are cross-sectional views illustrating the individual steps of fabricating the semiconductor device according to the second embodiment.

Figure 5A:
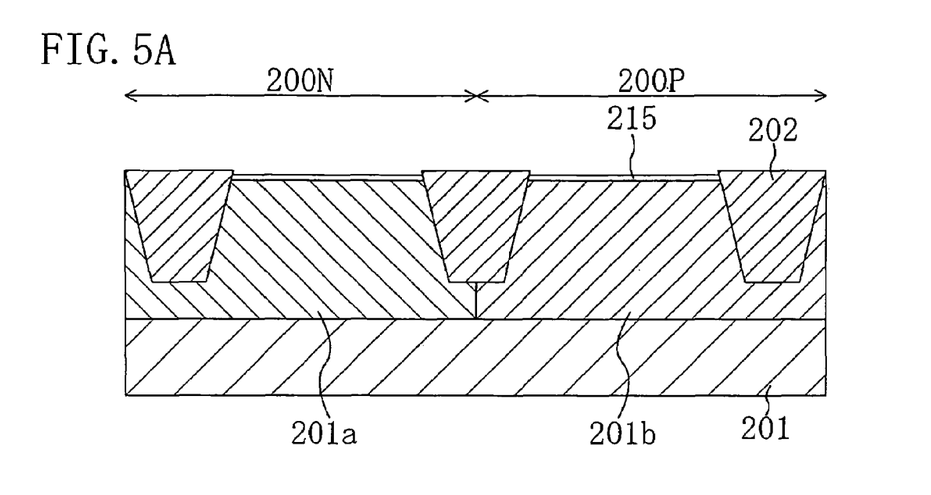
FIGS. 5A to 5C are cross-sectional views illustrating the individual steps of fabricating the semiconductor device according to the second embodiment.

First, in the step shown in FIG. 5A, the isolation insulating film 202 is formed to bury a trench and surround the active region of the substrate by a well-known shallow trench isolation formation process. Then, the p-well region 201a is formed in the NMIS formation region 200N, while the n-well region 201b is formed in the PMIS formation region 200P. Subsequently, a pad oxide film 215 is formed on each of the p-well region 201a and the n-well region 201b by thermal oxidation.

Figure 5B:
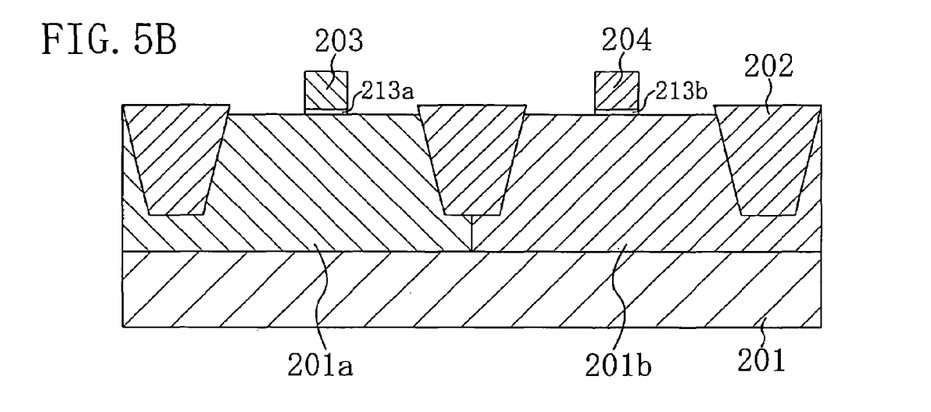

Next, in the step shown in FIG. 5B, polysilicon is deposited on the substrate and then patterned to form the gate insulating film 213a and the n-type gate electrode 203 with a gate length of 90 nm over the active region of the NMIS formation region 200N, while forming the gate insulating film 213b and the p-type gate electrode 204 with a gate length of 95 nm over the active region of the PMIS formation region 200P.

Figure 5C:
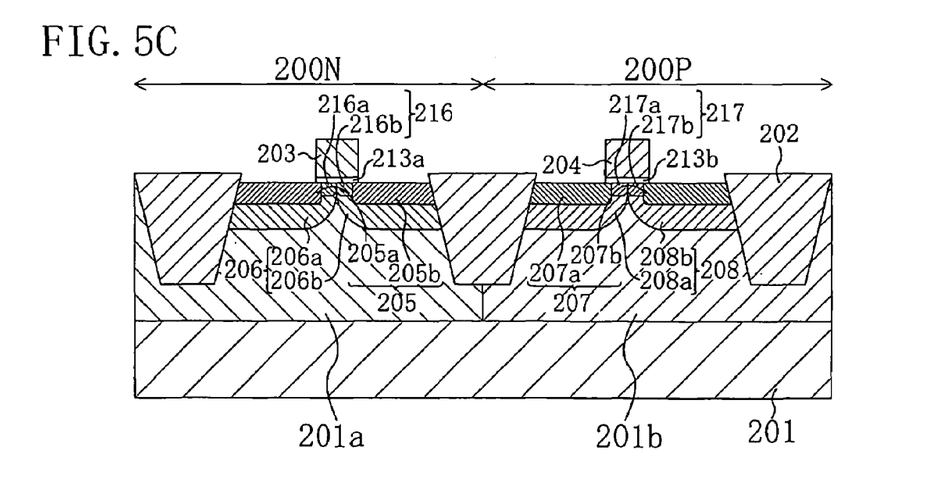

Next, in the step shown in FIG. 5C, a resist (not shown) having an opening corresponding to the NMIS formation region 200N formed with the n-type gate electrode 203 is formed to cover the PMIS formation region 200P. By using the resist and the n-type gate electrode 203 as a mask, n-type impurity ions such as arsenic ions are implanted into the p-well region 201a under such implant conditions that an acceleration energy is 5 keV, a dose is $8.0\times10^{15}$ atoms/cm$^2$, and an implant angle is 0 degree, whereby the n-type lightly doped diffusion layers 205 are formed in the respective regions (source-side and drain-side regions) of the p-well region 201a located below and on both sides of the n-type gate electrode 203. Subsequently, p-type impurity ions such as boron ions are implanted by using the same mask under such implant conditions that an acceleration energy is 12 keV, a dose is $7.0\times10^{12}$ atoms/cm$^2$, an implant angle is 25 degrees, and the number of rotations is 4, whereby the p-type pocket diffusion layers 206 are formed to surround the n-type lightly doped diffusion layers 205. At this time, the drain-side p-type pocket diffusion layer 206 and the source-side p-type pocket diffusion layer 206 are formed in overlapping relation with each other immediately below the n-type gate electrode 203.

Subsequently, a p-type impurity such as boron ions is implanted into the p-well region 201a by using the same mask as used in the step of forming the n-type lightly doped diffusion layers 205 under such conditions that an acceleration energy is 20 keV, a dose is $7.0\times10^{12}$ atoms/cm$^2$, an implant angle is 45 degrees, and the number of rotations is 4, whereby the first threshold control layers 216 are formed in the region of the p-well region 201a located under the gate insulating film 213a and interposed between the source-side n-type lightly doped diffusion layer and the drain-side n-type lightly doped diffusion layer. The implant energy for forming the p-type pocket diffusion layers 206 has been set herein higher than the implant energy for forming the n-type lightly doped diffusion layers 205. The implant angle for forming the p-type pocket diffusion layers 206 is set larger than the implant angle for forming the n-type lightly doped diffusion layers 205, while the ion implantation angle for forming the first threshold control layers 216 is set larger than the ion implantation angle for forming the p-type pocket diffusion layers 206. The first threshold control layers 216 are composed of the source-side first threshold control layer 216a and the drain-side first threshold control layer 216b in contact or overlapping relation with the source-side first threshold control layer 216a under the n-type gate electrode 203 and the gate insulating film 213a.

Next, the lightly doped diffusion layers, the pocket diffusion layers, and the threshold control layers are formed also in the PMIS region 200P.

Specifically, a resist (not shown) having an opening corresponding to the PMIS formation region 200P formed with the p-type gate electrode 204 is formed first to cover the NMIS formation region 200N. By using the resist and the p-type gate electrode 204 as a mask, p-type impurity ions such as boron ions are implanted into the n-well region 201b under such conditions that an acceleration energy is 0.7 keV, a dose is $1.8\times10^{14}$ atoms/cm$^2$, and an implant angle is 0 degree, whereby the p-type lightly doped diffusion layers 207 are formed in the respective regions (source-side and drain-side regions) of the n-well region 201b located below and on both sides of the p-type gate electrode 204. Subsequently, n-type impurity ions such as arsenic ions are implanted by using the same mask under such conditions that an acceleration energy is 70 keV, a dose is $7.0\times10^{12}$ atoms/cm$^2$, an implant angle is 25 degrees, and the number of rotations is 4, whereby the n-type pocket diffusion layers 208 are formed to surround the p-type lightly doped diffusion layers 207. At this time, the drain-side n-type pocket diffusion layer 208 and the source-side n-type pocket diffusion layer 208 are formed in overlapping relation with each other immediately below the p-type gate electrode 204.

Subsequently, an n-type impurity such as arsenic ions is implanted into the n-well region 201b by using the same mask as used in the step of forming the p-type lightly doped diffusion layers 207 under such conditions that an acceleration energy is 85 keV, a dose is $7.0\times10^{12}$ atoms/cm$^2$, an implant angle is 45 degrees, and the number of rotations is 4, whereby the second threshold control layers 217 are formed in the region of the n-well region 201b located under the gate insulating film 213b and interposed between the p-type lightly doped source diffusion layer and the p-type light doped drain diffusion layer. The implant energy for forming the n-type pocket diffusion layers 208 has been set herein higher than the implant energy for forming the p-type lightly doped diffusion layers 207. The implant angle for forming the n-type pocket diffusion layers 208 is set larger than the implant angle for forming the p-type lightly doped diffusion layers 207, while the ion implantation angle for forming the second threshold control layers 217 is larger than the ion implantation angle for forming the n-type pocket diffusion layers 208. The second threshold control layers 217 are composed of the source-side second threshold control layer 217a and the drain-side second threshold control layer 217b in contact or overlapping relation with the source-side second threshold control layer 217a immediately below the p-type gate electrode 204 and the gate insulating film 213b.

Although the example which forms the lightly doped diffusion layers, the pocket diffusion layers, and the threshold control layers in this order has been shown in the present step, these layers may be formed in any order. To form a desired profile, however, the implantation of arsenic is preferably performed prior to the implantation of boron since boron is readily diff-used in the semiconductor substrate made of Si or the like.

Figure 6A:
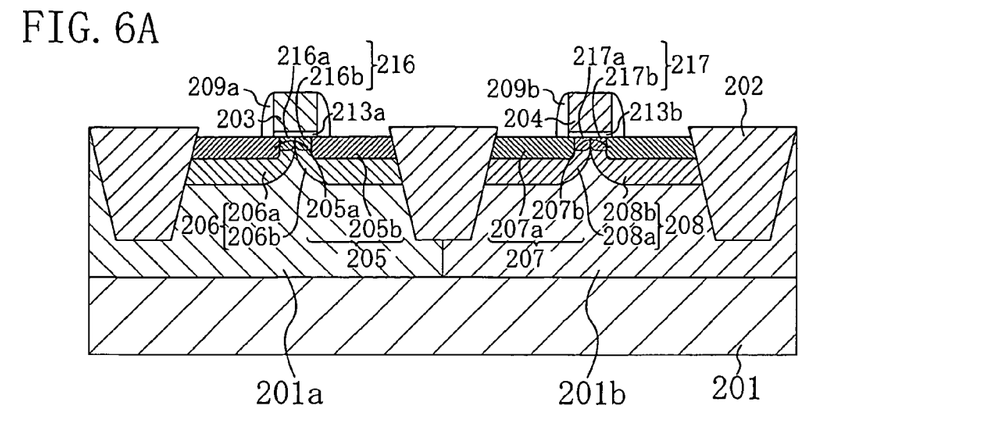
FIGS. 6A to 6C are cross-sectional views illustrating the individual steps of fabricating the semiconductor device according to the second embodiment.

Next, in the step shown in FIG. 6A, an insulating film is formed over the entire surface of the substrate and then etched by an etch-back process to simultaneously form the sidewalls 209a on the side surfaces of the n-type gate electrode 203 and the sidewalls 209b on the side surfaces of the p-type gate electrode 204.

Figure 6B:
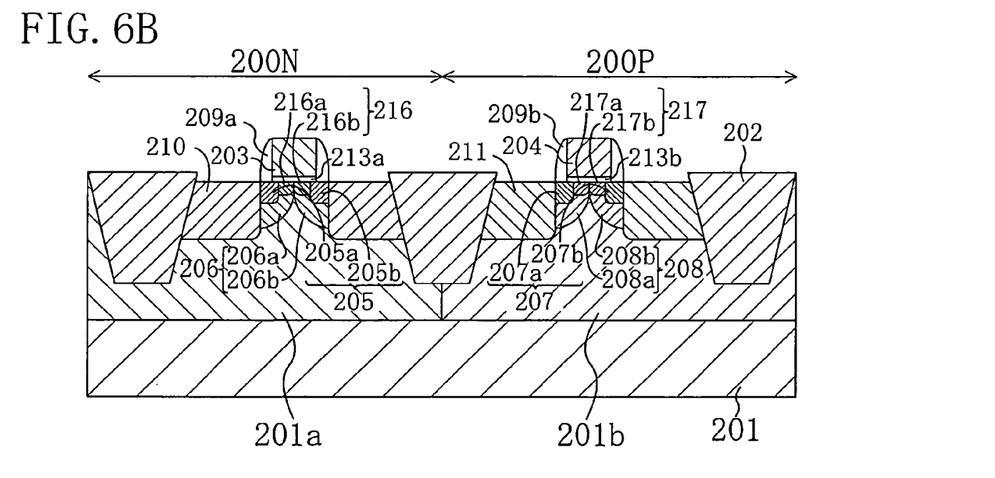

Next, in the step shown in FIG. 6B, a resist having an opening corresponding to the NMIS formation region 200N is formed to cover the PMIS formation region 200P. By using the resist, the n-type gate electrode 203, and the sidewalls 209a as a mask, n-type impurity ions such as arsenic ions are implanted into the p-well region 201a under such conditions that an acceleration energy is 50 keV, a dose is $5.0 \times 10^{15}$ atoms/cm$^2$, and an implant angle is 7 degrees, whereby the n-type heavily doped diffusion layers 210 serving as the n-type source/drain regions are formed in the respective regions of the p-well region 201a located laterally below the n-type gate electrode 203 and the sidewalls 209a.

Next, a resist having an opening corresponding to the PMIS formation region 200P is formed to cover the NMIS formation region 200N. By using the resist, the p-type gate electrode 204, and the sidewalls 209b as a mask, p-type impurity ions such as boron ions are implanted into the n-well region 201b under such conditions that an acceleration energy is 3 keV, a dose is $3.6 \times 10^{15}$ atoms/cm$^2$, and an implant angle is 7 degrees, whereby the p-type heavily doped diffusion layers 211 serving as the p-type source/drain regions are formed in the respective regions of the n-well region 201b located laterally below the p-type gate electrode 204 and the sidewalls 209b.

Figure 6C:
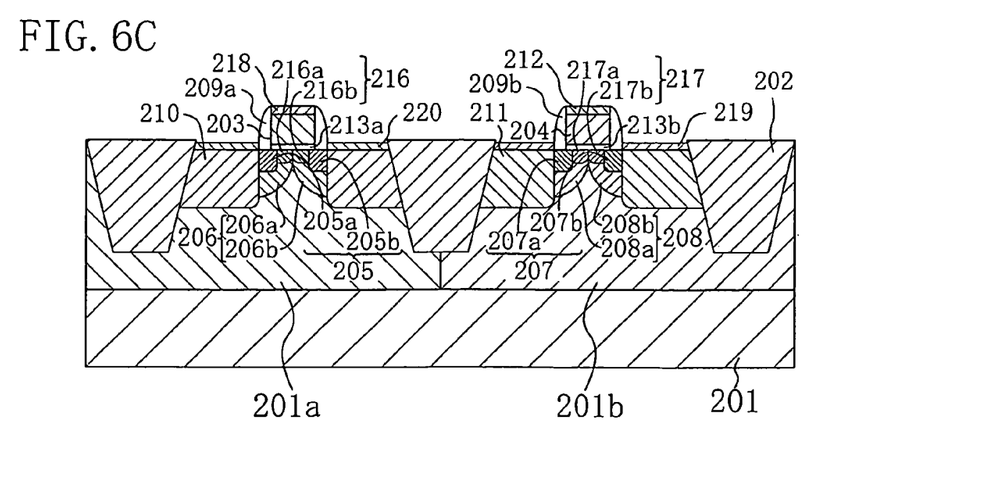

Next, in the step shown in FIG. 6C, the silicide layers 218, 212, 220, and 219 are formed on the n-type gate electrode 203, the p-type gate electrode 204, each of the n-type heavily doped diffusion layers 210, and each of the p-type heavily doped diffusion layers 211, respectively, by using a well-known salicide technology. The foregoing is the steps by which the semiconductor device according to the present embodiment can be fabricated.

The method for fabricating the semiconductor device according to the present embodiment enables precise setting of the threshold by providing the threshold control layers even when miniaturization further proceeds and makes it difficult to perform threshold control by using only the pocket diffusion layers. In addition, the method for fabricating the semiconductor device according to the present embodiment also allows the formation of the lightly doped diffusion layers, the pocket diffusion layers, and the threshold control layers using a common mask and thereby reduces the number of the fabrication steps, compared with the conventional method.

The embodiments thus far described are only exemplary of the semiconductor device according to the present invention so that the conditions for ion implantation, the configuration of the sidewalls, the configuration of the source/drain regions, and the like are not limited to these embodiments.

What is claimed is:

1. A semiconductor device comprising:
   a substrate;
   a semiconductor layer of a first conductivity type provided on the substrate;
   a gate insulating film provided on the semiconductor layer;
   a gate electrode provided on the gate insulating film;
   sidewalls composed of an insulator provided on each of side surfaces of the gate electrode;
   lightly doped source/drain diffusion layers each of a second conductivity type formed in respective regions of the semiconductor layer located laterally below the gate electrode;
   heavily doped source/drain diffusion layers formed in respective regions of the semiconductor layer located laterally below the sidewalls and each containing an impurity of the second conductivity type at a concentration higher than in each of the lightly doped source/drain diffusion layers;
   a source-side pocket diffusion layer of the first conductivity type formed in the semiconductor layer to cover at least a part of a side surface of the lightly doped source diffusion layer and a bottom surface thereof;
   a drain-side pocket diffusion layer of the first conductivity type formed in the semiconductor layer to cover at least a part of a side surface of the lightly doped drain diffusion layer and a bottom surface thereof;
   a source-side threshold control layer formed in a region of the semiconductor layer located above the source-side pocket diffusion layer and containing an impurity of the first conductivity at a concentration different from a concentration in the source-side pocket diffusion layer; and
   a drain-side threshold control layer formed in a region of the semiconductor layer located above the drain-side pocket diffusion layer and containing an impurity of the first conductivity at a concentration different from a concentration in the drain-side pocket diffusion layer,
   wherein the source-side pocket diffusion layer and the drain-side pocket diffusion layer are in contact or overlapping relation with each other below a central portion of the gate electrode in a gate length direction,
   a depth of each of the source-side pocket diffusion layer and the drain-side pocket diffusion layer in the semiconductor layer becomes smaller from below an edge of the gate electrode toward below the center portion of the gate electrode, and
   the source-side threshold control layer and the drain-side threshold control layer are in contact or overlapping relation with each other below the central portion of the gate electrode in the gate length direction.

2. The semiconductor device of claim 1, wherein the source-side pocket diffusion layer and the drain-side pocket diffusion layer are in overlapping relation with each other below the central portion of the gate electrode in the gate length direction.

3. The semiconductor device of claim 1, wherein a dose of an impurity of the first conductivity type contained in each of the source-side pocket diffusion layer and the drain-side pocket diffusion layer is not less than $1 \times 10^{13}$ atoms/cm$^2$ and not more than $1 \times 10^{15}$ atoms/cm$^2$.

4. The semiconductor device of claim 1, wherein the gate electrode has a gate length of 0.13 µm or less.

5. The semiconductor device of claim 1, wherein the sidewalls include first sidewalls provided on the side surfaces of the gate electrode and second sidewalls provided on the first sidewalls.

* * * * *